United States Patent [19]

Chern et al.

[11] Patent Number: 4,897,568

[45] Date of Patent: Jan. 30, 1990

[54] ACTIVE UP-PUMP FOR SEMICONDUCTOR SENSE LINES

[75] Inventors: Wen-Foo Chern; Ward D. Parkinson; Zhitong Chen; Gary M. Johnson; Tyler A. Lowrey; Thomas M. Trent, all of Boise, Id.

[73] Assignee: Micron Technology, Inc., Boise, Id.

[21] Appl. No.: 252,499

[22] Filed: Sep. 30, 1988

[51] Int. Cl.$^4$ .................. H03K 19/017; G11C 7/02
[52] U.S. Cl. ............................ 307/530; 307/448; 365/205; 365/207
[58] Field of Search ............... 307/443, 448, 451, 530, 307/279, 482; 365/203, 205, 207, 222

[56] References Cited

U.S. PATENT DOCUMENTS

| | | |
|---|---|---|
| 3,942,164 | 3/1976 | Dunn . |
| 4,279,023 | 7/1981 | Houghton . |
| 4,461,965 | 7/1984 | Chin . |
| 4,551,641 | 11/1985 | Pelley, III . |
| 4,634,901 | 1/1987 | McElroy . |
| 4,638,459 | 1/1987 | Pechar, Jr. et al. . |
| 4,694,205 | 9/1987 | Shu et al. .................. 307/530 |
| 4,752,699 | 6/1988 | Cranford, Jr. et al. . |

Primary Examiner—Stanley D. Miller
Assistant Examiner—Margaret Rose Wambach
Attorney, Agent, or Firm—Stan Protigal; Angus Fox; Jon Busack

[57] ABSTRACT

A pumpdown circuit uses voltage sensing to bring a low node to a potential of $V_{SS}+V_T$ by first grounding the node and then floating the node to the $V_{SS}+V_T$ potential. When a sensing node is at the $V_{SS}+V_T$ potential, the sensing node is maintained at a level above ground by leakage current through a pump-up circuit. Biasing the digit and digit* lines to a potential $V_T$ above ground reduces current (amperage) requirement, because the digit and digit* lines do not have to be discharged completely to ground. The momentary discharge of the sense amp node to ground allows the sense amp to behave like a conventional sense amp during initial sensing, thereby allowing a minimum digit/digit* sensing potential to approximate ground plus $V_T$.

19 Claims, 3 Drawing Sheets

4,897,568

ACTIVE UP-PUMP FOR SEMICONDUCTOR SENSE LINES

FIELD OF THE INVENTION

This invention relates to semiconductor circuit devices and more particularly to circuitry for charging sense lines on semiconductor integrated circuit devices which use a grounded p-substrate or p-well. In the circuit, a node is rapidly pulled from a high potential (approximating $V_{CC}/2$ or $V_{CC}$) to a potential of ground $+V_T$. The invention is particularly applicable to dynamic random access memory devices (DRAMS).

BACKGROUND OF THE INVENTION

The invention uses various materials which are electrically either conductive, insulating or semiconducting, although the completed semiconductor circuit device itself is usually referred to as a "semiconductor". One of the materials used is silicon, which is used as either single crystal silicon or as polycrystalline silicon material, referred to as polysilicon or "poly" in this disclosure.

In the operation of certain semiconductor circuit devices, such as DRAMS, it is necessary to draw down the latch node (or the sense node) of the sense amp to a certain low potential, for example, a potential of $V_{SS}$ or $V_{TN}$. The biasing of this node enables the sense amp to sense a differential in signals between signal sources, such as between digit and digit* lines. It is advantageous to very rapidly bring the potential of the node to the low value in order to reduce the time for the sense amp to detect the differential in signal levels of the digit and digit* lines.

In one prior art technique, the sense amp was strobed to a ground potential and the substrate was pumped to $-2.5V$ with respect to ground. The pumping of $V_{SS}$ to $-2.5V$ resulted in current consumption which would have been unnecessary if substrate was set to be equal to ground.

If the sense amp node were connected through a diode to ground, then the sense amp node would go in potential to a level of ground plus $V_T$ of the diode with the substrate grounded. This achieves the same effect as the case where the substrate is pumped to 2.5V. As the potential of the node approached ground plus $V_T$, the change in potential would tend to slow, resulting in the potential of the node hyperbolically approaching ground plus $V_T$. On the other hand, if the node was connected by a transistor to ground, then the potential of the node would rapidly drop past the desired ground plus $V_T$ and settle at ground potential. It would be desirable to have the potential of the node drop rapidly, as in the case of a transistor connection, but settle at a potential of ground plus $V_T$.

SUMMARY OF THE INVENTION

In accordance with the present invention, a voltage sensing circuit for grounded p-substrate memory chips is provided. During precharge cycle, one node is precharged to a potential of $V_{CC}-V_T$, which turns on a transistor gated to ground potential. A first active signal gates a precharge transistor to the ground connection, thus allowing the sensing node to discharge to ground. When the sensing node is at a potential of $V_{SS}+V_T$, the precharge circuit is gated off and the differential signals can be sensed. The sensing node is maintained at a level above ground by leakage current through a pump-up circuit.

By biasing the sense amp pull-down node to a potential $V_T$ above ground, this automatically back biases the access device, which is an n-channel access device. The access device is back biased negative with respect to the digit and digit* lines. The back biasing limits leakage current through the access device and therefore there is no requirement for a high $V_T$ for proper signal retention. Biasing the digit and digit* lines to a potential $V_T$ above ground also has the benefit of reducing current (amperage) requirement, because the digit and digit* lines do not have to be discharged completely to ground. The momentary discharge of the sense amp node to ground allows the sense amp to behave like a conventional sense amp during initial sensing, thereby allowing a minimum digit/digit* sensing potential to approximate ground plus $V_T$. Consequently:

(1) In operation of the DRAM, in order to sense the cell signal, as transferred to the digit line, the N latch node must pull from the same potential as digit ($V_{CC}$ or $V_{CC}/2$) to a low level, which typically is ground potential.

(2) It is desirable to pull the N latch node as rapidly as possible to low level in order to speed up the sensing process. This becomes more difficult if the digit and digit* has a large amplitude or capacitance. The most efficient way of accomplishing this process is to pull the N latch node directly to ground through a signal transistor of a large size.

(3) When the N latch node is at ground, the digit or digit* lines that discharged to a low level will settle at ground. In doing so, the pump substrate must either be at a negative potential to increase effective $V_T$ of the access device or greatly increase access device $V_T$ so that leakage current through area device is minimal when digit is at ground.

(4) Increased $V_T$ of access device directly cuts into amount of charge that can be stored at cell, which cuts into operating margins of chip. Also, smaller amounts of cell charge dictates that the N latch node must be pulled low slower in order to effect sensing.

(5) The N latch node being left at $V_T$ above ground and substrate at ground, achieves the effect of back biasing the access device, allowing the $V_T$ of the access device to be lower than line where the N latch node pulls all the way to ground.

(6) By leaving the N latch node at $V_T$ above ground instead of ground, this will contribute directly to reduction in operating current.

DETAILED DESCRIPTION OF THE PREFERRED EMBODIMENT

Figure 1:
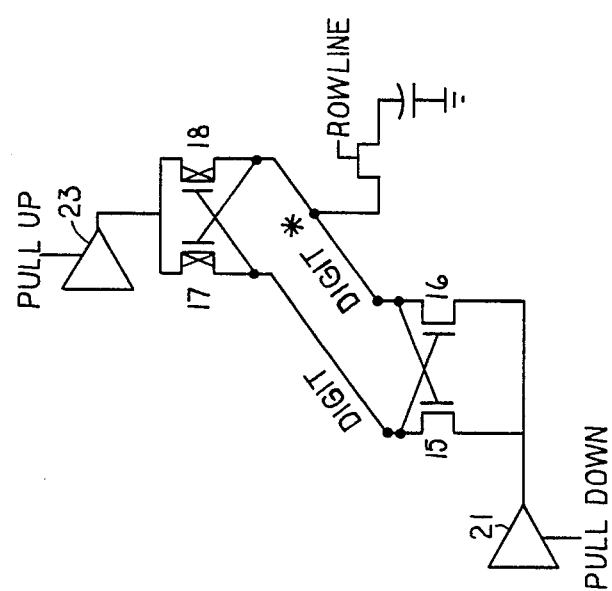
FIG. 1 shows a configuration for charge pumps for sense amp circuits.

Referring to FIG. 1, a sense amp consists of a plurality of cross-coupled transistors 15, 16, 17, 18 for detecting differential voltage (EMF) levels on digit and digit* lines.

While circuit elements are shown and described, in the preferred embodiment, each of these circuit elements is formed as a part of a semiconductor circuit chip. The described circuit functions find particular utility when integrated onto the chip, although it is possible to utilize the invention as one or more separate circuit elements.

The n-channel transistors 15 and 16 are connected at their sources to an N latch node, which functions as a low level voltage (EMF) source and their gate are cross-coupled to each other's drains. Their drains are connected to the digit and digit* lines respectively, so that their gates are responsive to the opposite digit or digit* lines in order that they may sense the differential signals on the digit and digit* lines.

Likewise, the sources of p-channel transistors 17 and 18 are connected to a pull-up amp 23 and the drains of transistors 17 and 18 are connected to the digit and digit* lines, respectively. The gates of transistors 17 and 18 are cross-coupled to the digit and digit* lines respectively, in order that transistor 17 and 18 can sense differential high levels on the digit and digit* lines.

The pull-up amp 23 conducts from $V_{CC}$ to transistors 17 and 18 in order to restore "one" levels in the array to their full potential after a "read" operation or during a refresh cycle. This helps to restore the "1" level of the signal which had just been read.

In order to bring the N latch node to a desired potential, an N latch charge pump 21, which functions as a pull-down amplifier, must conduct current from the N latch node. If the N latch charge pump 21 conducts current to the ground through a device (such as a diode) which has a threshold voltage ($V_T$), the potential at the N latch node will slowly pump down to a potential of ground $+V_T$, as shown in the top curve, marked Diode in FIG. 2.

The speed that the N latch node is pumped down controls the time required to read the individual cells in the memory array, and consequentially the access speed. The access speed is generally considered to be the speed of the device.

The operation of the N latch node at a potential of ground $+V_T$ has the advantage that the maximum time between refresh cycles is increased and the reliability of the part is thereby increased. Operating the part with the N latch node at the potential of ground $+V_T$ reduces the power consumption of the part because of reduced leakage current and the extension of time between refresh cycles. The operating margin of the part is reduced, however, because the minimum operating voltage $V_{CC}$ is increased due to the increase in the N latch node potential.

Figure 2:
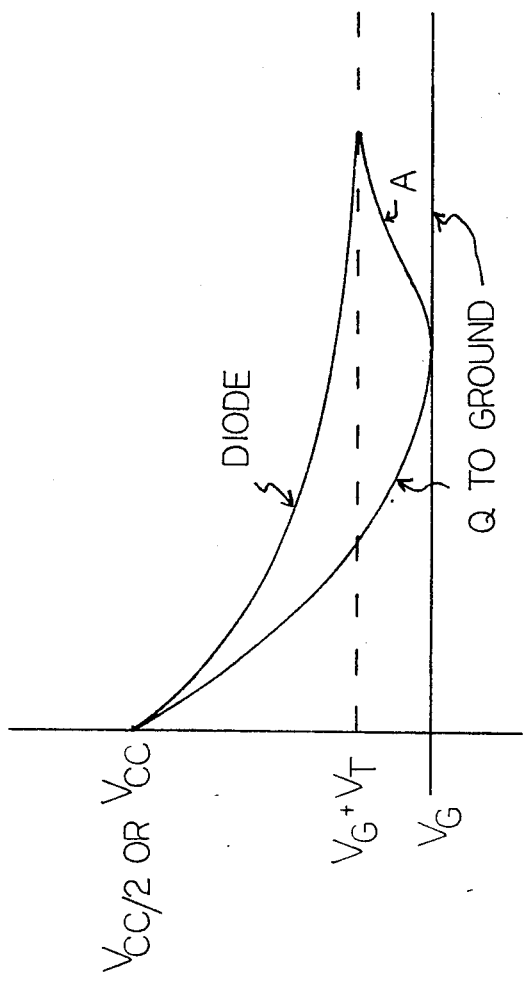
FIG. 2 is a graph, depicting charge pump operation in terms of voltage (EMF) over time.

If the N latch node were conducted by a transistor directly to ground potential, then the potential of the N latch node would drop more rapidly, but would continue to drop to ground potential, as shown in the curve marked "Q to Ground" in FIG. 2. Power consumption of the part increases because the N latch node at low potential brings the digit* line to the same low potential, thus drawing more operating current.

Curve A in FIG. 2 shows a desired characteristic in which the N latch node is conducted to ground potential, but is then permitted to float up to a potential of ground $+V_T$. The N latch node is then maintained at approximately the level of ground $+V_T$, rather than continuing to the low ground potential. In other words, the N latch node first rapidly is brought to a potential close to ground, decreasing access time and increasing the operating margin, and then the N latch node increases to a potential of ground $+V_T$. This shortens the access speed of the part and increases the operating margin, and then allows the maximum time between refresh cycles to increase and decreases power consumption.

The curves in FIG. 2 are shown to explain the operation of the circuit and do not represent actual measurements of voltage over time.

Figure 3:
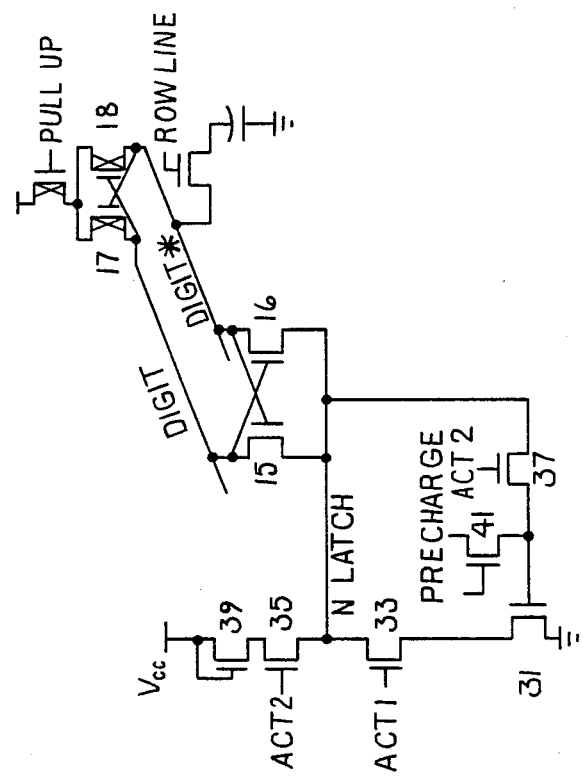
FIG. 3 shows a sense amp pump down circuit which reacts to changed potentials in order to shift characteristics in accordance with the invention.

Referring to FIG. 3, during precharge cycle, node A is precharged to $V_{CC}-V_T$, turning on transistor 31. In an active cycle, signal ACT 1 turns on transistor 33, allowing the N latch node to discharge to ground, thus activating the cross-coupled transistors 15 and 16 to sense the differential signals on the digit and digit* lines.

A first active signal ACT 1 turns on transistor 33, because transistor 31's gate is $V_{CC}-V_T$ (therefore on, the N latch node now has direct path to ground; thus ACT 1 starts the process of discharging the N latch node to ground.

After a predetermined delay later, a second active signal ACT 2 turns on transistors 35 and 37. Transistors 37 allows Node A to discharge to the same potential as the N latch node. This forms a diode configuration of transistor 37, and also turns on transistor 35. Transistor 35 is connected in series between the N latch node and a diode-connected threshold transistor 39. A high potential voltage source, $V_{CC}$, in the preferred embodiment is, in turn, connected in series between transistor 35 and the high potential voltage source $V_{CC}$. When transistor 37 is gated ON in response to signal ACT 2, the leakage path through transistor 35 and threshold transistor 39 eventually pulls the N latch node and A to a potential of $V_T$ above ground potential.

Transistors 35 and 39 are much smaller than transistor 33 and therefore the high potential part of the circuit (35 and 39) has a relatively high internal resistance. Because transistor 35 has more resistance than transistor 33, the N latch node is floated only to ground potential $+V_T$. Potential conducted through transistor 37 regulates the gating of transistor 31, so that current through transistor 31 is limited when the potential at the N latch node approaches the potential of ground $+V_T$. If the N latch node were to be left floating in a long RAS* low cycle, the N latch node may leak to ground potential.

Then latch node is brought to $V_T$ above ground as a result of the circuit path which includes transistors 35 and 39 being highly resistive. Therefore, substantially more current leaks through transistor 33 until potential of the N latch node approaches $V_T$ above ground potential. Therefore, transistor 35 pulls the N latch node from ground to $V_T$ above ground, and maintains the N latch node at $V_T$ above ground over long periods of active cycles. If transistor 35 were not present, the N latch node would float down to ground.

During precharge, ACT 1 and ACT 2 turns off transistors 33, 35 and 37, isolating the N latch node from power supply so the N latch node can equilibrate to mid-point. Also, the precharge signal will turn on transistor 41, bringing node A to $V_{CC}-V_T$.

The ability of the N latch charge pump 25 to first conduct to ground potential and then to conduct to a potential of ground $+V_T$ has a similar effect on speed as causing the hyperbolic portions of Curves D and G in FIG. 2 to be truncated at desired potentials. The N latch node is allowed to hyperbolically settle to a quiescent voltage, but only after the potential is within a desired voltage range.

While the invention has been described in terms of a DRAM, the circuit has utility in other circuits where it is desired to rapidly reduce voltage and then permit the voltage to remain at a desired level. Accordingly, the invention should be read as limited only by the claims.

We claim:

1. Semiconductor memory device having an array of circuit elements and a voltage sensing circuit comprising:
   (a) at least one pair of sense lines;
   (b) switches to selectively connect the elements in the array to at least one of the sense lines;
   (c) a low voltage latch node;
   (d) a pair of transistors connected between the low voltage latch node and the pair of sense lines, the pair of transistors being cross-connected so that the gate of each transistor is connected to a terminal, other than the gate, of the transistor;
   (e) a first pull down transistor connected to the low voltage latch node and conducting current from the low voltage latch node to a low potential source in response to a first active signal;
   (f) a voltage control transistor providing a voltage control signal;
   (g) a second pull down transistor connected between the first pull down transistor and the low potential source and gated off in response to the voltage control signal from the voltage control transistor;
   (h) the voltage control transistor being responsive to a second active signal to conduct current from the low voltage latch node to a gate of the second pull down transistor in order to provide the voltage control signal to the second pull down transistor;
   (i) a precharge circuit to gate the second pulldown transistor ON prior to the voltage control transistor responding to the second active signal;
   (j) a high potential source;
   (k) a threshold current supply transistor for providing sufficient current from the high potential source to float the low voltage latch node to a predetermined level above the low voltage potential, wherein the threshold voltage supply transistor is gated on in response to a second active signal.

2. Semiconductor memory device as described in claim 1, further comprising:
   the voltage control transistor providing a precharge potential to gate the second pulldown transistor ON prior to the voltage control transistor responding to the second active signal.

3. Semiconductor memory device as described in claim 1, further comprising:
   said low voltage latch node discharging to ground activating the cross-coupled transistors to sense potential differentials between the sense lines.

4. Semiconductor memory device as described in claim 1, further comprising:
   the threshold current supply transistor being connected in series to a high potential voltage source with a diode-connected threshold junction device, so that when the threshold current supply transistor is gated ON in response to the second active signal, a leakage path through the threshold current supply transistor and threshold junction device provides a predetermined current to the low voltage latch node to float the low voltage latch node to a desired potential above ground potential.

5. Semiconductor memory device as described in claim 1, further comprising:
   the semiconductor memory device being a dynamic random access memory (DRAM) device.

6. Voltage sensing circuit as described in claim 1, further comprising:
   the voltage control transistor providing a precharge potential to gate the second pulldown transistor ON prior to the voltage control transistor responding the second active signal.

7. Voltage sensing circuit as described in claim 1, further comprising:
   said low voltage latch node discharging to ground activating the cross-coupled transistors to sense potential differentials between the sense lines.

8. Voltage sensing circuit as described in claim 1, further comprising:
   the threshold current supply transistor being connected in series to a high potential voltage source with a diode-connected threshold junction device, so that when the threshold current supply transistor is gated ON in response to the second active signal, a leakage path through the threshold current supply transistor and threshold junction device provides a predetermined current to the low voltage latch node to float the low voltage latch node to a desired potential above ground potential.

9. Voltage sensing circuit as described in claim 1, further comprising:
   the semiconductor memory device being a dynamic random access memory (DRAM) device.

10. Semiconductor memory device as described in claim 2, further comprising:
    the second active signal gating ON the voltage control transistor to thereby supply a signal to the second pulldown transistor at the same potential as the low voltage latch node, thereby forming a diode configuration of the voltage control transistor and also turns on the threshold supply transistor.

11. Voltage sensing circuit as described in claim 2, further comprising:
    the second active signal gating ON the voltage control transistor to thereby supply a signal to the second pulldown transistor at the same potential as the low voltage latch node, thereby forming a diode configuration of the voltage control transistor and also turns on the threshold supply transistor.

12. Voltage sensing circuit as described in claim 3, further comprising:
    the second active signal being provided a predetermined time after the provision of the first active signal, the predetermined time delay coinciding with a time required for said sensing of potential differentials between the sense lines.

13. Semiconductor memory device as described in claim 3, further comprising:
    the second active signal being provided a predetermined time after the provision of the first active signal, the predetermined time delay coinciding with a time required for said sensing of potential differentials between the sense lines.

14. Semiconductor memory device as described in claim 4, further comprising:
    a circuit which includes the threshold current supply transistor having a high internal resistance relative to that of the pulldown transistor.

15. Voltage sensing circuit as described in claim 4, further comprising:

a circuit which includes the threshold current supply transistor having a high internal resistance relative to that of the pulldown transistor.

16. Voltage sensing circuit as described in claim 14, further comprising:
the semiconductor memory device being a dynamic random access memory (DRAM) device.

17. Semiconductor memory device as described in claim 14, further comprising:
the semiconductor memory device being a dynamic random access memory (DRAM) device.

18. In a semiconductor device having at least one pair of sense lines for sensing an electrical status of a circuit connected to at least one of the sense lines and a low voltage latch node, a voltage sensing circuit comprising:
(a) a pair of transistors connected between the low voltage latch node and the pair of sense lines, the pair of transistors being cross-connected so that the gate of each transistor is connected to a terminal, other than the gate, of the often transistor;
(b) a first pull down transistor connected to the low voltage latch node and conducting current from the low voltage latch node to a low potential source in response to a first active signal;
(c) a voltage control transistor providing a voltage control signal;
(d) a second pull down transistor connected between the first pull down transistor and the low potential source and gated off in response to the voltage control signal from the voltage control transistor;
(e) the voltage control transistor being responsive to a second active signal to conduct current from the low voltage latch node to a gate of the second pull down transistor in order to provide the voltage control signal to the second pull down transistor;
(f) a precharge circuit to gate the second pulldown transistor ON prior to the voltage control transistor responding to the second active signal;
(g) a high potential source;
(h) a threshold current supply transistor for providing sufficient current from the high potential source to float the low voltage latch node to a predetermined level above the low voltage potential, wherein the threshold voltage supply transistor is gated on in response to a second active signal;

19. Clamping circuit for semiconductor circuit device having a voltage controlled node comprising:
(a) a pair of transistors connected between the voltage controlled node and the pair of sense lines, the pair of transistors being cross-connected so that the gate of each transistor is connected to a terminal, other than the gate, of the other transistor;
(b) first and second active signal sources;
(c) a first pull down transistor connected to the voltage controlled node and conducting current from the voltage controlled node to a low potential source in response to a first active signal;
(d) a voltage control transistor providing a voltage control signal;
(e) a second pull down transistor connected between the first pull down transistor and the low potential source and gated off in response to the voltage control signal from the voltage control transistor;
(f) the voltage control transistor being responsive to a second active signal to conduct current from the voltage controlled node to a gate of the second pull down transistor in order to provide the voltage control signal to the second pull down transistor;
(g) a precharge circuit to gate the second transistor on prior to the voltage control transistor responding to the second active signal;
(h) a high potential source;
(i) a threshold current supply transistor for providing sufficient current from the high potential source to float the voltage controlled node to a predetermined level above the low voltage potential, wherein the threshold voltage supply transistor is gated on in response to the second active signal.

* * * * *

UNITED STATES PATENT AND TRADEMARK OFFICE
CERTIFICATE OF CORRECTION

PATENT NO. : 4,897,568
DATED : January 30, 1990
INVENTOR(S) : Wen-Foo Chern et al.

It is certified that error appears in the above-indentified patent and that said Letters Patent is hereby corrected as shown below:

Column 4, line 44, delete "Then" and insert -- The N --;

Column 5, line 16, delete "the transistor" and insert -- the other transistor --.

Signed and Sealed this

Twenty-third Day of November, 1993

Attest:

BRUCE LEHMAN

Attesting Officer

Commissioner of Patents and Trademarks